United States Patent
Aoki

(10) Patent No.: US 8,208,125 B2
(45) Date of Patent: Jun. 26, 2012

(54) PROJECTION OPTICAL SYSTEM AND EXPOSURE APPARATUS

(75) Inventor: Koji Aoki, Utsunomiya (JP)

(73) Assignee: Canon Kabushiki Kaisha (JP)

(*) Notice: Subject to any disclaimer, the term of this patent is extended or adjusted under 35 U.S.C. 154(b) by 470 days.

(21) Appl. No.: 12/574,299

(22) Filed: Oct. 6, 2009

(65) Prior Publication Data

US 2010/0085550 A1    Apr. 8, 2010

(30) Foreign Application Priority Data

Oct. 7, 2008    (JP) ................. 2008-261105

(51) Int. Cl.
*G02B 9/60* (2006.01)
*G03B 27/32* (2006.01)
*G03B 27/42* (2006.01)
*G03B 27/54* (2006.01)

(52) U.S. Cl. ............... 355/67; 355/53; 355/77; 359/766

(58) Field of Classification Search .............. 355/53, 355/67, 77; 359/766

See application file for complete search history.

(56) References Cited

U.S. PATENT DOCUMENTS 6,806,942 B2    10/2004    Schuster et al.
2009/0059358 A1*    3/2009    Epple ........................ 359/366

FOREIGN PATENT DOCUMENTS

JP    2003-202494 A    7/2003
JP    2004-046119 A    2/2004

* cited by examiner

*Primary Examiner* — Hung Henry Nguyen
*Assistant Examiner* — Colin Kreutzer
(74) *Attorney, Agent, or Firm* — Rossi, Kimms & McDowell LLP

(57) ABSTRACT

An projection optical system for an i-line projection exposure apparatus includes positive, negative, positive, negative and positive lens units which include a lens having an Abbe number equal to or smaller than 62. $0.125 \leq NAO$, $-0.251 < \beta < -0.249$, $80 \text{ mm} \leq |OB1max|$, $20 \text{ mm} \leq |OB2max|$, $|Dt/(NAO \cdot |OB1max|)| \leq 62.0$, $Dt/Td \leq 0.645$, $0.072 \leq |OB1max|/Td|$ are met, where NAO is a numerical aperture on the object plane, $\beta$ is an imaging magnification, Td is a distance on an optical axis from the object plane to the image plane, Dt is a sum of thicknesses of the glass materials on the optical axis in the projection optical system, OB1max is a maximum object height on the object plane, and OB2max is a maximum image height on the image plane.

9 Claims, 7 Drawing Sheets

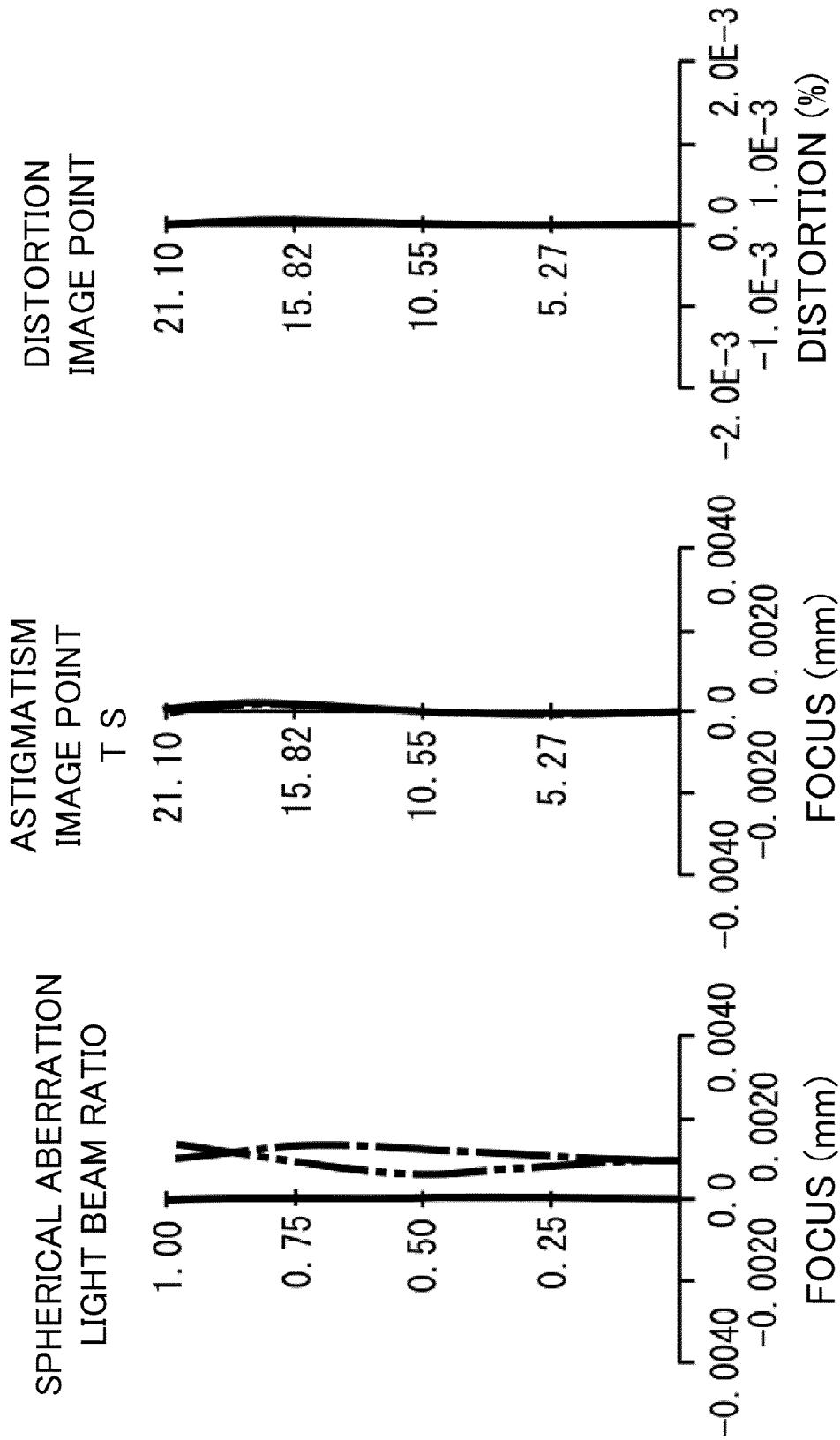

PROJECTION OPTICAL SYSTEM AND EXPOSURE APPARATUS

BACKGROUND OF THE INVENTION

1. Field of the Invention

The present invention relates to a projection optical system and an exposure apparatus.

2. Description of the Related Art

It is effective for an i-line projection exposure apparatus to intensify the light energy and to secure a broader exposure area so as to improve the throughput. However, the light absorbed in a glass material is turned into heat, and thus an improvement of the durability of the projection optical system to the light energy is necessary in intensifying the light energy.

In order to restrain the influence of the light energy, Japanese Patent Laid-Open No. ("JP") 2003-202494 discloses a projection optical system that includes a negative lens closest to an image plane made of a glass material having a high transmittance such that the lens can have a refractive index of 1.55 or smaller and an appropriate power. JP 2004-046119 discloses a projection optical system that restrains the influence of the light energy by limiting use volume of a less durable glass material having a high refractive index and a low Abbe number.

Nevertheless, each of the embodiments in JP 2003-202494 uses a less durable glass material having a refractive index of 1.57 or higher for the entire projection optical system, and the overall projection system is too thick to sufficiently reduce the influence of the light energy, causing its imaging characteristic to deteriorate. In addition, in each of the embodiments of JP 2004-046119, maximum heights of the object plane (first object plane) and the image plane (second object plane) are too small to secure a broad exposure area. Thus, the conventional i-line projection exposure apparatus cannot sufficiently improve the throughput.

BRIEF SUMMARY OF THE INVENTION

The present invention provides a projection optical system and an exposure apparatus having the same, which can maintain an imaging characteristic to the light having a high energy and secure a broad exposure area.

A projection optical system used for an exposure apparatus that uses an i-line as a light source is configured to project a pattern of an original that is placed on an object plane onto a substrate that is placed on an image plane. The projection optical system includes a plurality of lenses made of a plurality of types of different glass materials which include a lens having an Abbe number equal to or smaller than 62. The plurality of lenses includes, in order from the object plane along an optical path, a first lens unit having a positive power, a second lens unit having a negative power, a third lens unit having a positive power, a fourth lens unit having a negative power, and a fifth lens unit having a positive power. $0.125 \leq NAO$, $-0.251 < \beta < -0.249$, $80 \text{ mm} \leq |OB1max|$, $20 \text{ mm} \leq |OB2max|$, $|Dt/(NAO \cdot |OB1max|)| \leq 62.0$, $Dt/Td \leq 0.645$, $0.072 \leq |OB1max|/Td|$ are met, where NAO is a numerical aperture of the projection optical system on the object plane, $\beta$ is an imaging magnification of the projection optical system, Td is a distance on an optical axis from the object plane to the image plane, Dt is a sum of thicknesses of the glass materials on the optical axis in the projection optical system, OB1max is a maximum object height on the object plane, and OB2max is a maximum image height on the image plane.

Further features of the present invention will become apparent from the following description of exemplary embodiments with reference to the attached drawings.

BRIEF DESCRIPTION OF THE DRAWINGS

FIG. 2 is a longitudinal aberration diagram of the projection optical system according to the first embodiment.

DESCRIPTION OF THE EMBODIMENTS

Referring now to the accompanying drawings, a description will be given of a projection optical system of the present invention.

First Embodiment

Figure 1:
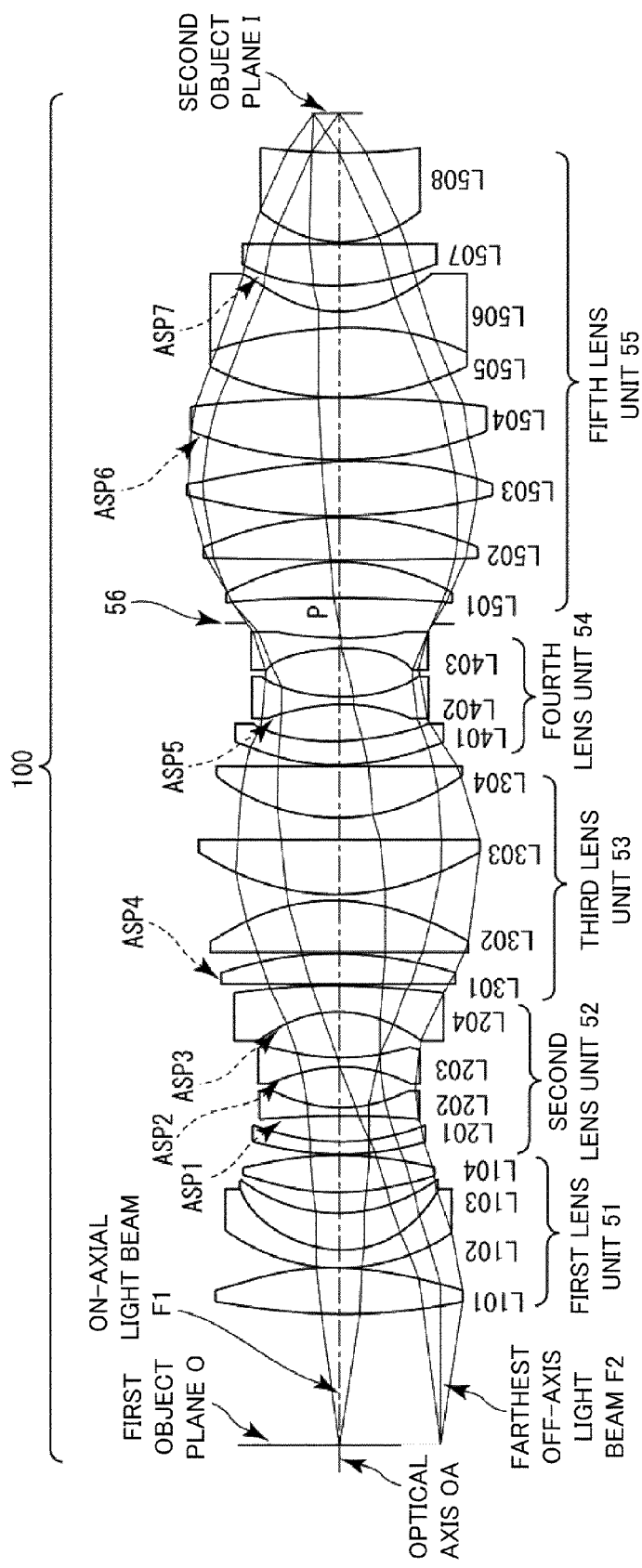
FIG. 1 is an optical path diagram of a projection optical system according to a first embodiment.

FIG. 1 is an optical path diagram of a projection optical system 100 according to a first embodiment. The projection optical system 100 is a dioptric system configured to project a pattern of an original that is placed on a first object plane (object plane) O onto a substrate that is placed on a second object plane (image plane) I. The projection optical system 100 includes a plurality of lenses made of a plurality of types of different glass materials, which includes a lens having Abbe number vd that is equal to or smaller than 62.

The projection optical system 100 includes, in order from the first object plane O along the optical path, a first lens unit 51, a second lens unit 52, a third lens unit 53, a fourth lens unit 54, and a fifth lens unit 55. The projection optical system 100 may further include an aberration correcting optical system among these lens units. In that case, it is sufficient as long as the first lens unit 51 to the fifth lens unit exist except for the aberration correcting optical system. In addition, the following equations are met even when there is an aberration correcting optical system.

The first lens unit 51 includes lenses L101-L104, and has a positive power. The second lens unit 52 includes lenses L201-L204, and has a negative power. The third lens unit 53 includes lenses L301-L304, and has a positive power. The fourth lens unit 54 includes lenses L401-L403, and has a negative power. The fifth lens unit 55 includes lenses L501-L508, and has a positive power. An aperture stop 56 is located near a pupil position P on an optical axis OA between the fourth lens unit 54 and the fifth lens unit 55. The lens L102 is bonded with the lens L103 via an adhesive agent, and the lens L505 is bonded with the lens L506 via an adhesive agent.

A lens surface of the lens L202 on the first object plane side is an aspheric surface ASP1. A lens surface of the lens L203 on the first object plane side is an aspheric surface ASP2. A lens surface of the lens L204 on the first object plane side is an aspheric surface ASP3. A lens surface of the lens L301 on the second object plane side is an aspheric surface ASP4. A lens surface of the lens L402 on the first object plane side is an aspheric surface ASP5. A lens surface of the lens L504 on the second object plane side is an aspheric surface ASP6. A lens surface of the lens L507 on the first object plane side is an aspheric surface ASP7.

The projection optical system 100 is a telecentric optical system on both the first object plane side and the second object plane side.

The projection optical system 100 satisfies the following equations, where NAO is a numerical aperture on the first object plane O, $\beta$ is an imaging magnification, OB1max is a maximum height (maximum object height) on the first object plane O, and OB2max is a maximum height (maximum image height) on the second object plane O:

$$0.125 \leq NAO \leq 0.2 \quad \text{Equation 1}$$

$$-0.251 < \beta < -0.249 \quad \text{Equation 2}$$

$$80 \text{ mm} \leq |OB1max| \leq 100 \text{ mm} \quad \text{Equation 3}$$

$$20 \text{ mm} \leq |OB2max| \leq 25 \text{ mm} \quad \text{Equation 4}$$

In the Equations 1-4, when a target value is less than a lower limit, it is difficult to secure a broad exposure area, and when the target value is higher than an upper limit, it is difficult to maintain a good imaging characteristic.

The projection optical system 100 satisfies the following equations where Td is a distance on an optical axis from the first object plane O to the second object plane I, and Dt is a sum of thicknesses of the lens glass materials on the optical axis in the overall projection optical system:

$$50 \leq |Dt/(NAO \cdot |OB1max|)| \leq 62.0 \quad \text{Equation 5}$$

$$0.5 \leq Dt/Td \leq 0.645 \quad \text{Equation 6}$$

$$0.072 \leq |OB1max|/Td| \leq 0.14 \quad \text{Equation 7}$$

In the Equations 5 and 6, when a target value is less than a lower limit, it is difficult to maintain the good imaging characteristic, and when the target value is higher than an upper limit, the durability to the high energy light may deteriorate. The Equations 5-6 are conditional equations to make thin the lens glass material and to reduce a light absorption amount.

In the Equation 7, when a target value is less than a lower limit, the overall optical system becomes excessively large relative to the exposure area, the light absorption amount becomes large, and the durability to the high energy light may deteriorate. When the target value is higher than an upper limit, it is difficult to maintain the good imaging characteristic.

The projection optical system 100 satisfies the following equation where S1 is an air conversion distance from the first object plane O to a surface on the first object plane side of one of lenses that are made of a glass material that is not quartz and has a refractive index of 1.48 or higher, which one is closest to the second object plane I.

$$102 \text{ mm} \leq S1 \leq 150 \text{ mm} \quad \text{Equation 8}$$

The projection optical system 100 satisfies the following equation where S2 is an air conversion distance from the first object plane O to a surface on the second object plane side of one of lenses that are made of a glass material that is not quartz and has a refractive index of 1.48 or higher, which one is closest to the second object plane I:

$$80 \text{ mm} \leq S2 \leq 120 \text{ mm} \quad \text{Equation 9}$$

In general, a glass material having a low refractive index has a high transmittance and a high durability to the light energy. For example, quartz is a glass material having a refractive index of 1.48 or lower to the i-line having a reference wavelength $\lambda = 365.018$ nm, and a high durability to the light energy. The light condenses and the luminance becomes high near each of the first object plane and the second object plane of the general projection optical system during exposure.

In the Equations 8-9, when a target value is less than a lower limit, the lens moves closer to the high luminance position and it becomes difficult to improve the durability to the high energy light. The Equations 8-9 also suggest an improvement of the durability to the light energy by using a glass material having a high transmittance and a low absorption index. When the target value is higher than an upper limit, it is difficult to maintain the good imaging characteristic.

The projection optical system 100 satisfies the following conditional equations where d1 is a sum of thicknesses of the glass materials of the first lens unit 51 on the optical axis, and d2 is a sum of thicknesses of the glass materials of the second lens unit 52 on the optical axis:

$$0.10 \leq (d1+d2)/Td \leq 0.165 \quad \text{Equation 10}$$

$$0.15 \leq (d1+d2)/Dt \leq 0.250 \quad \text{Equation 11}$$

The imaging magnification variation, the distortion, and the curvature of field occur as the light energy increases or as the accumulated exposure time increases, and are comparatively influential among the aberrations that worsen the imaging characteristic. In addition, a directional difference of the imaging magnification (a so-called aspect ratio) is an aberration which is hard to correct by the aberration correcting mechanism configured to maintain the imaging characteristic in the exposure.

In the projection optical system 100, the imaging magnification variation, the distortion, the curvature of field, and the directional difference of the imaging magnification (so-called aspect ratio) become conspicuous in an area in which the on-axis light beam F1 emitted from the center of the first object plane O is distant from the farther off-axis light beam F2 emitted from the maximum image point position of the first object plane O. It is effective to restrain the thicknesses of the first lens unit and the second lens unit in the area in which the on-axis light beam F1 is distant from the farther off-axis light beam F2. Therefore, the upper limits of the Equations 10 and 11 are to reduce the light absorption amount by reducing the thicknesses of the lens glass materials and to restrain the imaging magnification variation, the distortion, the curvature of field, and the directional difference of the imaging magnification (so-called aspect ratio). In the Equations 10 and 11, when the target value is less than the lower limit, it is thus difficult to maintain the good imaging characteristic by restraining another aberration.

The projection optical system 100 satisfies the following conditional equations where N is a refractive index of a glass material, vd is an Abbe number of the glass material, Kt is the number of lenses made of the glass material that satisfies $N \leq 1.57$ or $vd \leq 62$, and Gt is a sum of thicknesses of the glass materials on the optical axis which satisfy $N \leq 1.57$ or $vd \leq 62$:

$$2 \leq Kt \leq 5 \quad \text{Equation 12}$$

$$0.020 \leq Gt/Td \leq 0.050 \quad \text{Equation 13}$$

Since a glass material having a high refractive index generally has a small Abbe number, a glass material having a high refractive index is particularly used to correct the chromatic aberration, but the glass material having the high refractive index generally has a low transmittance and is less durable to the light energy. Therefore, in order to restrain the negative influence of the high energy light upon the optical characteristic, it is effective to restrain the number of lenses and a thickness of the glass material having a high refractive index and a small Abbe number.

The upper limits in the Equations 12 and 13 limit the number of lenses and its thickness ratio to the overall length of the optical system of the glass material having a high refractive index or a small Abbe number. In other words, in the Equations 12 and 13, when the target value exceeds the upper limit, it is difficult to reduce the negative influence of the light energy. In addition, in the Equations 12 and 13, when the target value is lower than the lower limit, it is difficult to maintain the imaging characteristic by restraining another aberration, such as a chromatic aberration.

The projection optical system 100 satisfies the following equation, where P1 is a distance along the optical axis between a pupil (or pupil position P) and the surface on the second object plane side of the lens L403 that is arranged on the first object plane side of the pupil and closest to the pupil:

$$0.01 \leq |P1/Td| \leq 0.02 \qquad \text{Equation 14}$$

The projection optical system 100 satisfies the following equation, where P2 is a distance along the optical axis between the pupil (or pupil position P) and the surface on the second object plane side of the lens L501 that is placed on the second object plane side of the pupil and closest to the pupil:

$$0.014 \leq |P2/Td| \leq 0.03 \qquad \text{Equation 15}$$

In the Equations 14 and 15, when the target value is less than the lower limit, the glass material adjacent to the aperture stop near the pupil of the projection optical system which has a high luminance during exposure is likely to get damaged and the optical characteristic is likely to deteriorate. The Equations 14 and 15 are conditional equations to restrain the deterioration of the imaging characteristic caused by the high light energy by securing a sufficient distance between the aperture stop 56 arranged near the pupil of the projection optical system 100 which has a high luminance during exposure, and the glass material (L403 and L501) adjacent to the aperture stop 56 position. In other words, the lower limits of the Equations 14 and 15 are to arrange the lens at a position that is not a high luminance position. In addition, in the Equations 14 and 15, when the target value exceeds the upper limit, it is difficult to maintain the good imaging characteristic because of another aberration.

The projection optical system 100 has a quartz lens that is closest to the pupil (or the pupil position P) on the first object plane side or the second object plane side of the pupil so as to restrain the deterioration of the imaging characteristic caused by the high light energy.

The projection optical system 100 uses for the second lens unit 52 having a negative power at least two lenses made of quartz having an extremely high durability to the light energy, and a low refractive index. Thereby, the imaging magnification variation, the distortion, the curvature of field, and a directional difference of the imaging magnification (so-called aspect ratio) which are likely to occur particularly in the second lens unit 52, can be effectively restrained among the deterioration factors of the imaging characteristic caused by the high light energy. Moreover, use of quartz having a low refractive index for the negative lens makes easy a correction of a Petzval sum in the overall projection optical system, and provides good corrections of the curvature of field and the astigmatism.

Table 1 below shows a principal specification of numerical example 1 of the projection optical system 100. Tables 2 and 3 show detailed numerical data, and Table 4 indicate aspheric coefficients of the aspheric shapes. The refractive indexes in the Tables 2 and 3 are those to the i-line as the light source having a reference wavelength λ=365.018 nm. The Abbe numbers in the Tables 2 and 3 are values of νd, as provided by the equations below where nd is a refractive index to the d-line (587.6 nm), a refractive index to the F-line (486.1 nm), and a refractive index to the C-line (656.3 nm):

$$\nu d = (nd-1)/(nF-nC) \qquad \text{Equation 16}$$

An aspheric shape is given by the equation below where X is a displacement amount from a lens vertex in the optical axis direction, H is a distance from the optical axis, ri is a radius of curvature, k is a conical constant, A, B, C, D, E, F, and G are aspheric coefficients:

$$X = (H^2/4)/(1+((1-(1+k)\cdot(H/r)^2))^{1/2}) + AH^4 + BH^6 + CH^8 + DH^{10} + EH^{12} + FH^{14} + GH^{16} \qquad \text{Equation 17}$$

The air conversion distance that provide the values of S1 and S2 are defined as a value of a thickness divided by a refractive index of a medium.

TABLE 1

| Numerical Example 1: Principal Specification | |
|---|---|
| NAO | 0.1425 |
| β | −0.25 |
| Td | 1119.942 |
| \|OB1max\| | 84.4 |
| \|OB2max\| | 21.1 |
| \|OB1max/Td\| | 0.0754 |
| S1 | 110.203 |
| S2 | 84.819 |
| Dt | 706.983 |
| Dt/(NAO * \|OBmax1\|) | 58.783 |
| Dt/Td | 0.6313 |
| d1 | 111.927 |
| d2 | 48.652 |
| d3 | 162.150 |
| d4 | 36.272 |
| d5 | 347.977 |
| (d1 + d2)/Td | 0.1434 |
| (d1 + d2)/Dt | 0.2271 |
| Kt | 4 |
| Gt | 45.472 |
| Gt/Td | 0.0406 |
| \|P1/Td\| | 0.0118 |
| \|P2/Td\| | 0.0166 |
| Quartz before and after P | 1 |
| Quartz for the second lens unit | 4 |

TABLE 2

| | | Numerical Example 1: Detailed Numerical Data | | |
|---|---|---|---|---|
| Lens Number | Surface Number | Radius of Curvature | Thickness | Refractive Index |
| | First Object Plane | 0.0000000 | 110.2031716 | 1 (air) |
| L101 | 1 | 447.8668980 | 37.7784437 | 1.50409 |
| | 2 | −309.1426644 | 1.1000000 | 1 (air) |
| L102 | 3 | 157.0965977 | 13.4000000 | 1.57920 |
| | 4 | 91.0451075 | 0.0030000 | 1.53574 |
| L103 | 5 | 91.0451075 | 31.6100551 | 1.50409 |
| | 6 | 121.1618617 | 19.3264729 | 1 (air) |
| L104 | 7 | 228.9131469 | 29.1383737 | 1.50409 |
| | 8 | −470.4000458 | 1.1000004 | 1 (air) |
| L201 | 9 | 233.6310011 | 11.9559115 | 1.47452 |
| | 10 | 165.5423180 | 19.3682323 | 1 (air) |
| L202 | 11 | −631.7414047 | 9.0000005 | 1.47452 |
| | 12 | 130.1259043 | 34.0299310 | 1 (air) |
| L203 | 13 | −132.0396171 | 9.0000000 | 1.47452 |

TABLE 2-continued

Numerical Example 1: Detailed Numerical Data

| Lens Number | Surface Number | Radius of Curvature | Thickness | Refractive Index |
|---|---|---|---|---|
|  | 14 | 217.6654160 | 37.3808976 | 1 (air) |
| L204 | 15 | −100.4502474 | 18.6961816 | 1.47452 |
|  | 16 | −1080.6145131 | 1.1000000 | 1 (air) |
| L301 | 17 | 1488.9018409 | 28.3050447 | 1.50409 |
|  | 18 | −237.6583044 | 1.1233800 | 1 (air) |
| L302 | 19 | 12822.9548287 | 44.1575309 | 1.50409 |
|  | 20 | −183.7975990 | 4.8251209 | 1 (air) |
| L303 | 21 | 199.9450723 | 46.8398006 | 1.50409 |
|  | 22 | −67276.8610527 | 19.1907485 | 1 (air) |
| L304 | 23 | 176.0937292 | 42.8475982 | 1.50409 |
|  | 24 | −7752.3714547 | 1.1011558 | 1 (air) |
| L401 | 25 | 202.7335752 | 18.0000000 | 1.50409 |
|  | 26 | 173.2761859 | 30.4999815 | 1 (air) |
| L402 | 27 | −378.8441011 | 9.2716801 | 1.57920 |
|  | 28 | 139.7279110 | 40.3076711 | 1 (air) |
| L403 | 29 | −121.7187238 | 9.0000001 | 1.61928 |
|  | 30 | 513.3402050 | 13.2604213 | 1 (air) |
|  | 31 | 0.0000000 | 18.6238305 | 1 (air) |
|  | (Aperture Stop) |  |  |  |
| L501 | 32 | −1147.0757612 | 31.3754010 | 1.47452 |
|  | 33 | −174.7772333 | 1.1055239 | 1 (air) |
| L502 | 34 | 2709.8317611 | 34.8153341 | 1.50409 |
|  | 35 | −279.8568302 | 2.2651871 | 1 (air) |
| L503 | 36 | 445.8994545 | 45.9058753 | 1.50409 |
|  | 37 | −420.8241977 | 1.1041785 | 1 (air) |
| L504 | 38 | 268.6059521 | 52.2876100 | 1.50409 |
|  | 39 | −1103.4855522 | 1.1000008 | 1 (air) |
| L505 | 40 | 225.3239226 | 58.4827928 | 1.50409 |
|  | 41 | −282.9352714 | 0.0030000 | 1.53574 |
| L506 | 42 | −282.9352714 | 13.8000000 | 1.61928 |
|  | 43 | 115.7410190 | 21.4202614 | 1 (air) |
| L507 | 44 | 206.6044302 | 35.5238239 | 1.50409 |
|  | 45 | −2672.3409479 | 1.1137700 | 1 (air) |
| L508 | 46 | 95.8457318 | 75.7857685 | 1.47452 |
|  | 47 | 244.9967531 | 32.3088085 | 1 (air) |
|  | Second Object Plane | 0.0000000 | 0.0000000 |  |

TABLE 3

Numerical Example 1: Detailed Numerical Data

| Lens Number | Surface Number | Abbe Number | Effective Diameter |
|---|---|---|---|
|  | First Object Plane |  | 168.800 |
| L101 | 1 | 70.2 | 205.966 |
|  | 2 |  | 206.273 |
| L102 | 3 | 45.8 | 190.403 |
|  | 4 |  | 165.640 |
| L103 | 5 | 70.2 | 165.638 |
|  | 6 |  | 160.395 |
| L104 | 7 | 70.2 | 160.097 |
|  | 8 |  | 157.663 |
| L201 | 9 | 67.8 | 144.796 |
|  | 10 |  | 134.961 |
| L202 | 11 | 67.8 | 133.462 |
|  | 12 |  | 124.133 |
| L203 | 13 | 67.8 | 124.099 |
|  | 14 |  | 133.530 |
| L204 | 15 | 67.8 | 136.533 |
|  | 16 |  | 173.758 |
| L301 | 17 | 70.2 | 185.000 |
|  | 18 |  | 193.416 |
| L302 | 19 | 70.2 | 210.024 |
|  | 20 |  | 215.477 |
| L303 | 21 | 70.2 | 234.522 |
|  | 22 |  | 231.751 |
| L304 | 23 | 70.2 | 206.170 |
|  | 24 |  | 199.244 |
| L401 | 25 | 70.2 | 171.594 |
|  | 26 |  | 151.973 |
| L402 | 27 | 45.8 | 147.886 |
|  | 28 |  | 132.741 |
| L403 | 29 | 40.8 | 132.491 |
|  | 30 |  | 148.336 |
|  | 31 |  | 156.263 |
|  | (Aperture Stop) |  |  |
| L501 | 32 | 67.8 | 179.038 |
|  | 33 |  | 187.822 |
| L502 | 34 | 70.2 | 222.395 |
|  | 35 |  | 227.818 |
| L503 | 36 | 70.2 | 251.876 |
|  | 37 |  | 253.010 |
| L504 | 38 | 70.2 | 247.418 |
|  | 39 |  | 241.120 |
| L505 | 40 | 70.2 | 215.115 |
|  | 41 |  | 204.917 |
| L506 | 42 | 40.8 | 204.914 |
|  | 43 |  | 159.592 |
| L507 | 44 | 70.2 | 159.155 |
|  | 45 |  | 152.735 |
| L508 | 46 | 67.8 | 134.158 |
|  | 47 |  | 82.435 |
|  | Second Object Plane |  | 42.200 |

TABLE 4

Numerical Example 1: Aspheric Coefficient

| Surface Number | k | A | B | C |
|---|---|---|---|---|
| 11 | −4.9690E−01 | 8.5712E−08 | −8.3082E−12 | 7.1032E−16 |
| 13 | −8.0180E−01 | −3.9988E−08 | 1.6168E−11 | 2.2252E−18 |
| 15 | −6.0931E−01 | 5.6285E−08 | −1.0592E−12 | −1.5621E−16 |
| 18 | −1.0000E+00 | 6.0230E−08 | −4.3217E−13 | −3.8923E−17 |
| 27 | 1.0000E+00 | −1.1081E−07 | 4.2795E−12 | 2.5688E−16 |
| 38 | −8.8881E−01 | 5.7020E−09 | −8.7700E−14 | −1.8724E−18 |
| 44 | 8.7063E−01 | 1.8374E−08 | 1.1067E−12 | 7.4620E−17 |

| Surface Number | D | E | F | G |
|---|---|---|---|---|
| 11 | −7.4874E−20 | 2.5721E−23 | −4.3833E−27 | 3.7647E−31 |
| 13 | −3.7871E−19 | 8.2575E−23 | −1.0300E−26 | 7.3665E−31 |
| 15 | 5.8882E−20 | −1.6081E−24 | 5.8141E−28 | 6.6365E−33 |
| 18 | 4.2800E−22 | 6.8286E−26 | −1.1941E−29 | 5.4078E−34 |
| 27 | −1.0341E−20 | −1.4786E−24 | 1.0721E−28 | −1.0860E−33 |
| 38 | 2.5970E−23 | −2.5480E−27 | 1.5248E−31 | −3.4605E−36 |
| 44 | 3.5731E−23 | 1.7337E−24 | −2.1914E−28 | 1.6478E−32 |

The projection optical system 100 of the numerical example 1 satisfies the Equations 1-15, as shown in the Table 1, and uses quartz for the glass materials for the lenses L201 to L204 in the second lens unit 52. The projection optical system 100 of the numerical example 1 uses quartz for the glass material of the lens L501 adjacent to the aperture stop 56, and uses quartz for the glass material of the lens L508 that is closest to the second object plane I.

Figures 3A, 3B:
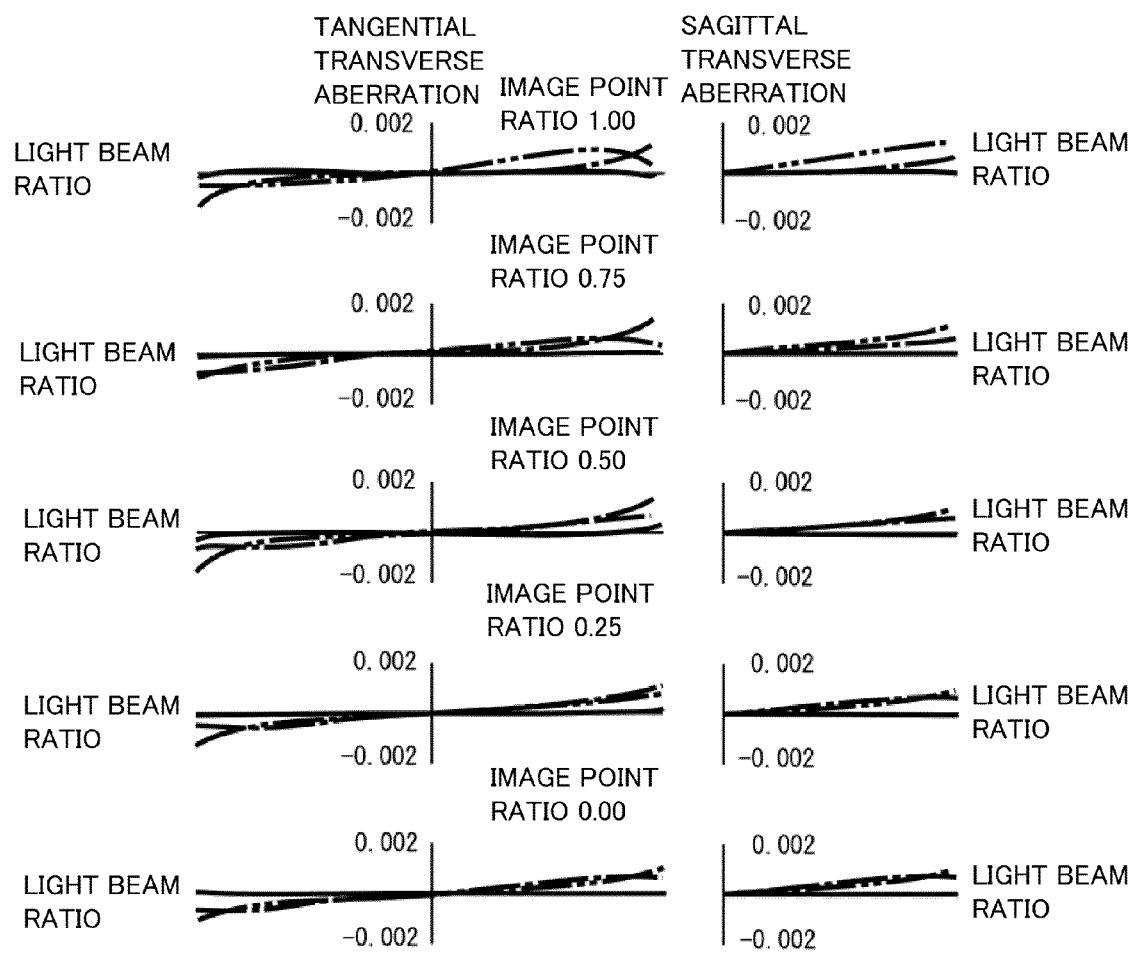
FIG. 3 is a transverse aberration diagram of the projection optical system according to the first embodiment.
Figure 4:
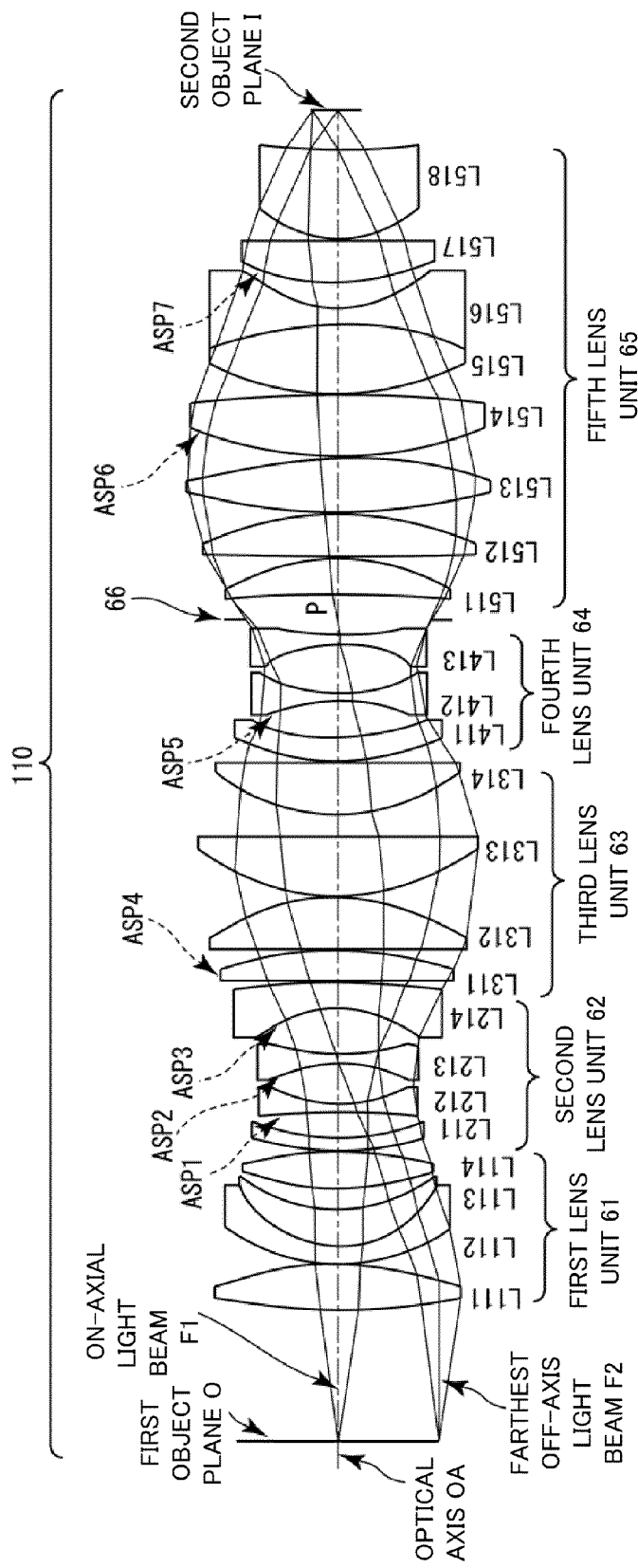
FIG. 4 is an optical path diagram of a projection optical system according to a second embodiment.

A detailed description will now be given of the imaging characteristic of the projection optical system 100 according to the numerical example 1. FIGS. 2A-2C show a longitudinal aberration and a distortion of the projection optical system according to the numerical example 1. FIGS. 3A and 3B show transverse aberrations (comas) in the tangential direction and the sagittal direction. In each aberration diagram, the image point indicates an image point on the second object plane. In the astigmatism diagram, a dotted line indicates a tangential image plane, and a solid line indicates a sagittal image plane. In the spherical aberration diagram, a solid line indicates the i-line having a reference wavelength of 365.015 nm, an alternate long and short dash line indicates an aberration of +3 nm (368.015 nm) relative to the reference wavelength, and an alternate long and two short dashes line indicates an aberration of −3 nm (362.015 nm) relative to the reference wavelength.

As apparent from FIG. 2A-3B, the spherical aberration, the astigmatism, the distortion, and coma of the projection optical system 100 of the numerical example 1 are properly corrected and well-balanced over the entire broad exposure area.

Second Embodiment

A description will now be given of a projection optical system 110 according to a second embodiment. The projection optical system 110 is a dioptric system configured to project a pattern of an original that is placed on a first object plane (object plane) O onto a substrate that is placed on a second object plane (image plane) I. The projection optical system 110 includes a plurality of lenses made of a plurality of types of different glass materials, which includes a lens of Abbe number equal to or smaller than 62.

The projection optical system 110 includes, in order from the first object plane O along the optical path, a first lens unit 61, a second lens unit 62, a third lens unit 63, a fourth lens unit 64, and a fifth lens unit 65. The projection optical system 110 may further include an aberration correcting optical system among these lens units. In that case, it is sufficient that the first lens unit 61 to the fifth lens unit 65 exist except for the aberration correcting optical system. In addition, the following equations are met even when there is an aberration correcting optical system.

The first lens unit 61 includes lenses L111-L114, and has a positive power. The second lens unit 62 includes lenses L211-L214, and has a negative power. The third lens unit 63 includes lenses L311-L314, and has a positive power. The fourth lens unit 64 includes lenses L411-L413, and has a negative power. The fifth lens unit 65 includes lenses L511-L518, and has a positive power. An aperture stop 66 is arranged near a pupil position P on the optical axis OA between the fourth lens unit 64 and the fifth lens unit 65. The lens L112 is bonded with the lens L113 via an adhesive agent, and the lens L515 is bonded with the lens L516 via an adhesive agent.

A lens surface of the lens L212 on the first object plane side is an aspheric surface ASP1. A lens surface of the lens L213 on the first object plane side is an aspheric surface ASP2. A lens surface of the lens L214 on the first object plane side is an aspheric surface ASP3. A lens surface of the lens L311 on the second object plane side is an aspheric surface ASP4. A lens surface of the lens L412 on the first object plane side is an aspheric surface ASP5. A lens surface of the lens L514 on the second object plane side is an aspheric surface ASP6. A lens surface of the lens L517 on the first object plane side is an aspheric surface ASP7.

The projection optical system 110 is a telecentric optical system on both of the first object plane side and the second object plane side. The projection optical system 110 satisfies the Equations 1 to 15.

Table 5 below shows a principal specification of numerical example 2 of the projection optical system 110. Tables 6 and 7 show detailed numerical data, and Table 8 indicate aspheric coefficients of the aspheric shapes. Definitions of the specification and the numerical values are similar to those of the numerical example 1:

TABLE 5

Numerical Example 2: Principal Specification

| | |
|---|---|
| NAO | 0.1425 |
| β | −0.25 |
| Td | 1119.942 |
| \|OB1max\| | 84.4 |
| \|OB2max\| | 21.1 |
| \|OB1max/Td\| | 0.0754 |
| S1 | 112.629 |
| S2 | 84.929 |
| Dt | 704.133 |
| Dt/(NAO * \|OBmax1\|) | 58.546 |
| Dt/Td | 0.6287 |
| d1 | 111.478 |
| d2 | 48.777 |
| d3 | 162.501 |
| d4 | 36.360 |
| d5 | 345.017 |
| (d1 + d2)/Td | 0.1431 |
| (d1 + d2)/Dt | 0.2276 |
| Kt | 4 |
| Gt | 45.560 |
| Gt/Td | 0.0407 |
| \|P1/Td\| | 0.0124 |
| \|P2/Td\| | 0.0141 |
| Quartz before and after P | 1 |
| Quartz for the second lens unit | 2 |

TABLE 6

Numerical Example 2: Detailed Numerical Data

| Lens Number | Surface Number | Radius of Curvature | Thickness | Refractive Index |
|---|---|---|---|---|
| | First Object Plane | 0.0000000 | 112.6286711 | 1 (air) |
| L111 | 1 | 473.1564801 | 37.4146228 | 1.50409 |
| | 2 | −305.2791755 | 1.1000000 | 1 (air) |
| L112 | 3 | 150.1461007 | 13.4000000 | 1.57920 |
| | 4 | 90.1537197 | 0.0030000 | 1.53574 |
| L113 | 5 | 90.1537197 | 32.1166346 | 1.50409 |
| | 6 | 118.4568117 | 20.2841344 | 1 (air) |
| L114 | 7 | 230.4911172 | 28.5466724 | 1.50409 |
| | 8 | −487.5028178 | 1.1000000 | 1 (air) |
| L211 | 9 | 216.8064522 | 11.5448368 | 1.50409 |
| | 10 | 157.6189962 | 20.3613324 | 1 (air) |
| L212 | 11 | −569.4887667 | 9.0000000 | 1.47452 |
| | 12 | 128.1127826 | 33.1255947 | 1 (air) |
| L213 | 13 | −138.2109597 | 9.0223326 | 1.47452 |
| | 14 | 217.7691238 | 36.6466736 | 1 (air) |
| L214 | 15 | −100.4414988 | 19.2099276 | 1.50409 |
| | 16 | −1097.0211571 | 1.1000000 | 1 (air) |
| L311 | 17 | 1447.7914443 | 28.4224653 | 1.50409 |
| | 18 | −238.0079946 | 1.1000000 | 1 (air) |
| L312 | 19 | 22112.0146345 | 44.0579919 | 1.50409 |
| | 20 | −182.0752303 | 1.1355419 | 1 (air) |
| L313 | 21 | 200.4306189 | 47.3873418 | 1.50409 |
| | 22 | −8252.9740601 | 16.7216123 | 1 (air) |
| L314 | 23 | 179.1812425 | 42.6333442 | 1.50409 |
| | 24 | −7807.2882207 | 1.1000000 | 1 (air) |
| L411 | 25 | 211.5040325 | 18.0000000 | 1.50409 |
| | 26 | 180.3904721 | 30.8226252 | 1 (air) |
| L412 | 27 | −374.8712584 | 9.3577116 | 1.57920 |
| | 28 | 140.5101032 | 42.0364529 | 1 (air) |
| L413 | 29 | −121.6921706 | 9.0019010 | 1.61928 |
| | 30 | 607.8962086 | 13.8695625 | 1 (air) |
| | 31 | 0.0000000 | 15.7529775 | 1 (air) |

TABLE 6-continued

Numerical Example 2: Detailed Numerical Data

| Lens Number | Surface Number | Radius of Curvature | Thickness | Refractive Index |
|---|---|---|---|---|
| | | (Numerical Aperture) | | |
| L511 | 32 | −1102.9938097 | 32.5667697 | 1.47452 |
| | 33 | −172.8782345 | 1.1612406 | 1 (air) |
| L512 | 34 | 3301.5837592 | 35.5078733 | 1.50409 |
| | 35 | −271.2074827 | 1.2158651 | 1 (air) |
| L513 | 36 | 474.3357677 | 42.6690868 | 1.50409 |
| | 37 | −473.5621078 | 1.1000000 | 1 (air) |
| L514 | 38 | 259.1614066 | 57.6048035 | 1.50409 |
| | 39 | −873.3585395 | 1.1000000 | 1 (air) |
| L515 | 40 | 228.3390186 | 57.7150179 | 1.50409 |
| | 41 | −296.0889856 | 0.0030000 | 1.53574 |
| L516 | 42 | −296.0889856 | 13.8000000 | 1.61928 |
| | 43 | 115.0909129 | 24.1953264 | 1 (air) |
| L517 | 44 | 206.7236431 | 36.1699415 | 1.50409 |
| | 45 | −2197.0490704 | 1.1000019 | 1 (air) |
| L518 | 46 | 95.6510628 | 68.9838054 | 1.47452 |
| | 47 | 242.9029784 | 37.0453074 | 1 (air) |
| | Second Object Plane | 0.0000000 | 0.0000000 | |

TABLE 7

Numerical Example 2: Detailed Numerical Data

| Lens Number | Surface Number | Abbe Number | Effective Diameter |
|---|---|---|---|
| | First Object Plane | | 168.800 |
| L111 | 1 | 70.2 | 206.226 |
| | 2 | | 206.593 |
| L112 | 3 | 45.8 | 190.367 |
| | 4 | | 165.301 |
| L113 | 5 | 70.2 | 165.300 |
| | 6 | | 159.686 |
| L114 | 7 | 70.2 | 159.308 |
| | 8 | | 156.802 |
| L211 | 9 | 70.2 | 143.495 |
| | 10 | | 133.753 |
| L212 | 11 | 67.8 | 132.199 |
| | 12 | | 122.913 |
| L213 | 13 | 67.8 | 122.927 |
| | 14 | | 131.994 |
| L214 | 15 | 70.2 | 134.945 |
| | 16 | | 172.224 |
| L311 | 17 | 70.2 | 183.641 |
| | 18 | | 192.394 |
| L312 | 19 | 70.2 | 209.054 |
| | 20 | | 214.640 |
| L313 | 21 | 70.2 | 234.200 |
| | 22 | | 231.527 |
| L314 | 23 | 70.2 | 207.319 |
| | 24 | | 200.440 |
| L411 | 25 | 70.2 | 173.807 |
| | 26 | | 154.440 |
| L412 | 27 | 45.8 | 150.456 |
| | 28 | | 135.580 |
| L413 | 29 | 40.8 | 135.515 |
| | 30 | | 152.808 |
| | 31 (Aperture Stop) | | 162.486 |
| L511 | 32 | 67.8 | 180.375 |
| | 33 | | 189.388 |
| L512 | 34 | 70.2 | 224.732 |
| | 35 | | 230.027 |
| L513 | 36 | 70.2 | 253.404 |
| | 37 | | 254.564 |
| L514 | 38 | 70.2 | 251.439 |
| | 39 | | 244.946 |
| L515 | 40 | 70.2 | 216.778 |
| | 41 | | 206.657 |
| L516 | 42 | 40.8 | 206.654 |
| | 43 | | 160.497 |
| L517 | 44 | 70.2 | 159.925 |
| | 45 | | 153.375 |
| L518 | 46 | 67.8 | 134.188 |
| | 47 | | 88.252 |
| | Second Object Plane | | 42.200 |

TABLE 8

Numerical Example 2: Aspheric Coefficient

| Surface Number | k | A | B | C |
|---|---|---|---|---|
| 11 | 0.97034155 | 8.31E−08 | −8.35E−12 | 7.16E−16 |
| 13 | −0.73157715 | −4.43E−08 | 1.63E−11 | 1.92E−16 |
| 15 | −0.60280803 | 5.53E−08 | −1.16E−12 | −2.18E−16 |
| 18 | −0.99536247 | 6.02E−08 | −4.04E−13 | −4.42E−17 |
| 27 | 0.953340762 | −1.11E−07 | 4.08E−12 | 2.42E−16 |
| 38 | −0.88100557 | 5.77E−09 | −8.83E−14 | −1.72E−18 |
| 44 | 0.875533337 | 1.85E−08 | 1.15E−12 | 7.13E−17 |

| Surface Number | D | E | F | G |
|---|---|---|---|---|
| 11 | −6.80E−20 | 2.61E−23 | −4.30E−27 | 3.95E−31 |
| 13 | −3.93E−19 | 7.21E−23 | −9.11E−27 | 6.18E−31 |
| 15 | 5.68E−20 | −9.21E−25 | 8.71E−28 | 5.09E−33 |
| 18 | 5.71E−22 | 1.40E−25 | −1.91E−29 | 7.21E−34 |
| 27 | −9.78E−21 | −1.18E−24 | 8.96E−29 | −1.63E−33 |
| 38 | 5.20E−23 | −5.26E−27 | 3.10E−31 | −6.45E−36 |
| 44 | 6.16E−22 | 1.94E−24 | −2.60E−28 | 1.87E−32 |

The projection optical system 110 of the numerical example 2 satisfies the Equations 1-15, as shown in the Table 5, and uses quartz for the glass materials for the lenses L212 to L213 in the second lens unit 62. The projection optical system 110 of the numerical example 2 uses quartz for the glass material of the lens L511 adjacent to the aperture stop 66, and uses quartz for the glass material of the lens L518 that is closest to the second object plane I.

Figures 5A, 5B, 5C:
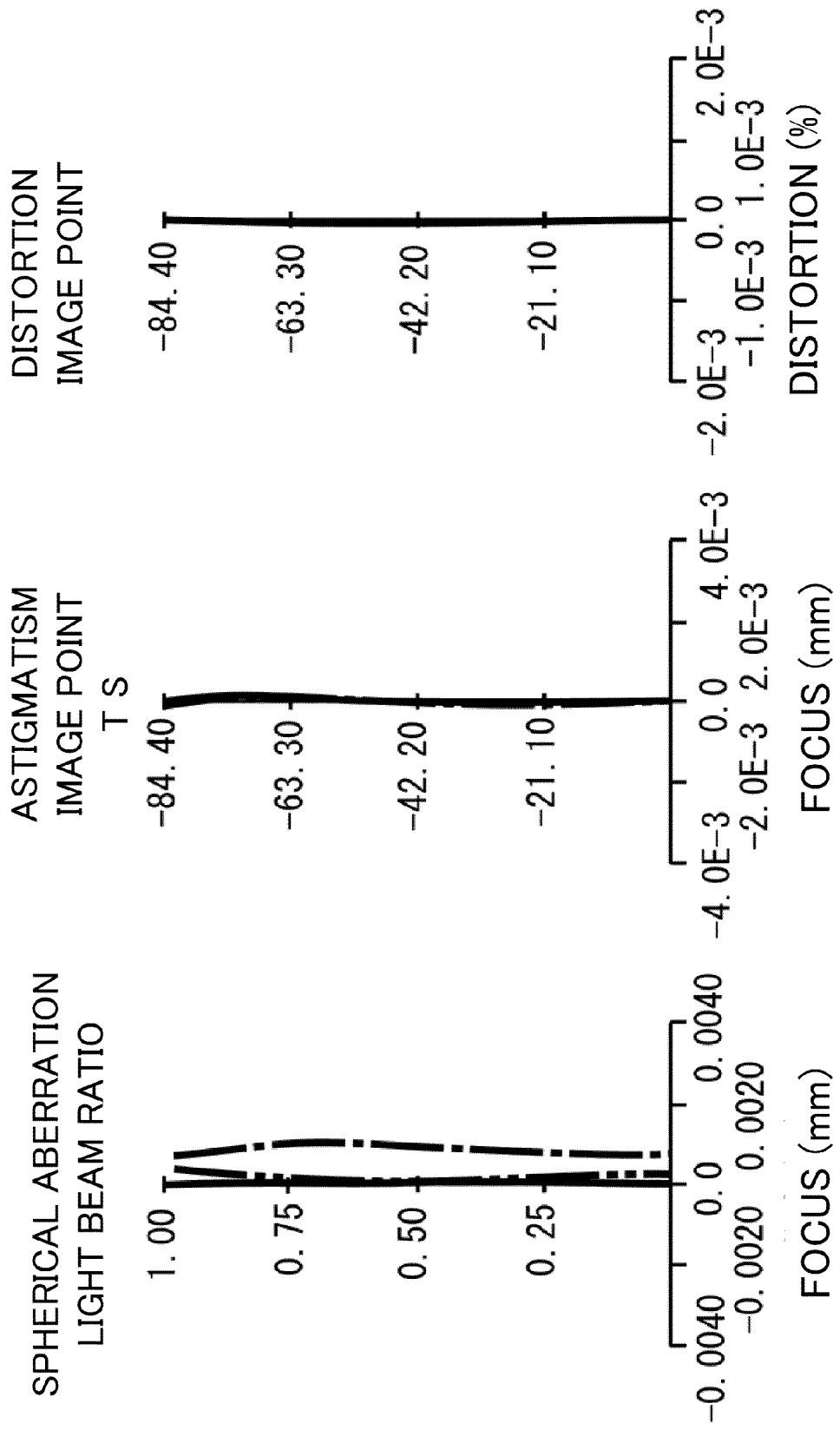
FIG. 5 is a longitudinal aberration diagram of the projection optical system according to the second embodiment.
Figures 6A, 6B:
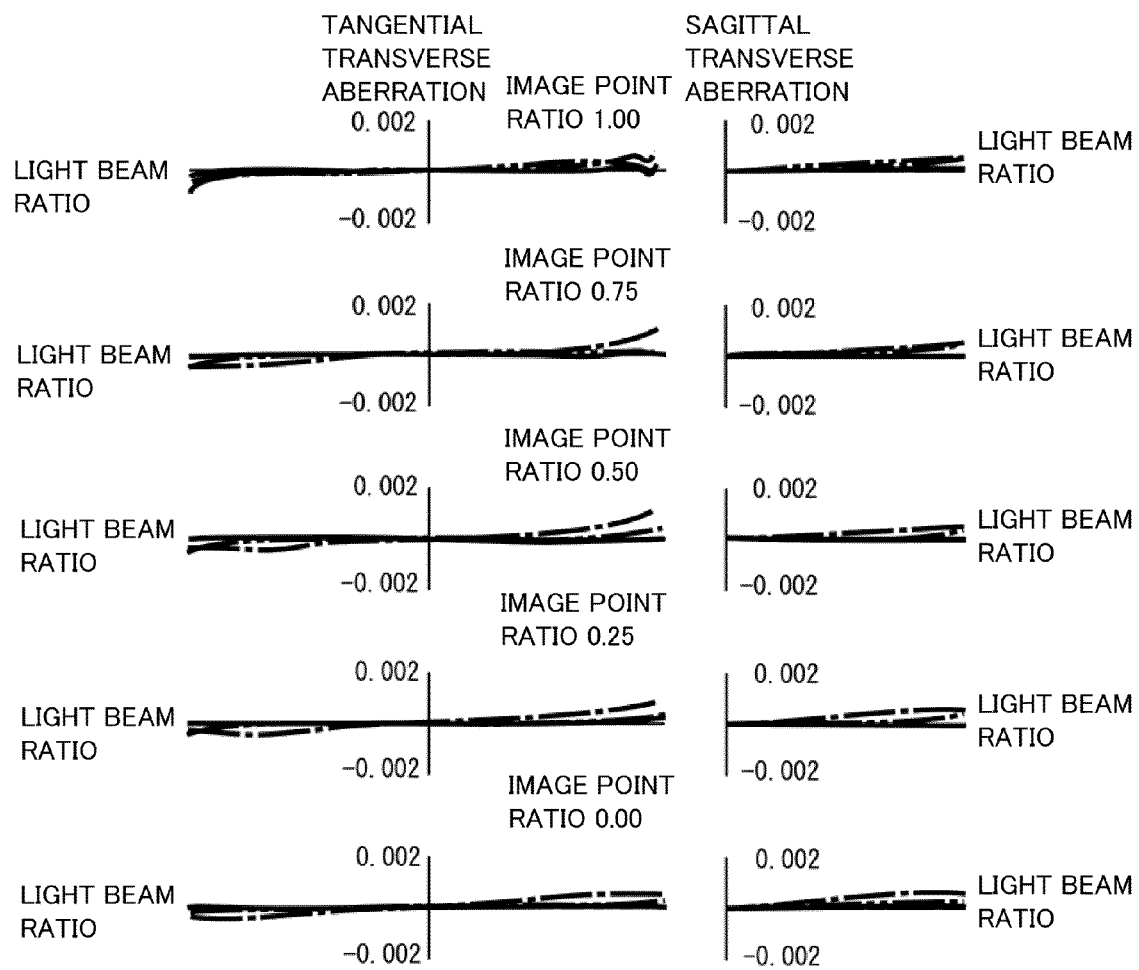
FIG. 6 is a transverse aberration diagram of the projection optical system according to the second embodiment.

A detailed description will now be given of the imaging characteristic of the projection optical system 110 according to the numerical example 2. FIGS. 5A-5C show a longitudinal aberration and a distortion of the projection optical system 110 according to the numerical example 2. FIGS. 6A and 6B show transverse aberrations (comas) in the tangential direction and in the sagittal direction. The definitions in FIGS. 5A-6B are similar to those of the first embodiment.

As apparent from FIG. 5A-6B, the spherical aberration, the astigmatism, the distortion, and coma of the projection optical system 110 of the numerical example 2 are properly corrected over the entire broad exposure area. In addition, the aberrations containing the chromatic aberration of the projection optical system 110 of the numerical example 2 are corrected and well-balanced over the exposure area.

As described above, the projection optical system 100 or 110 restrains the deterioration of the imaging characteristic that would otherwise occur when the lens glass material absorbs the light. In addition, the projection optical system 100 or 110 secures a broad exposure area and a sufficiently large numerical aperture, maintains a miniaturization, and corrects a variety of aberrations containing the chromatic aberration.

Figure 7:
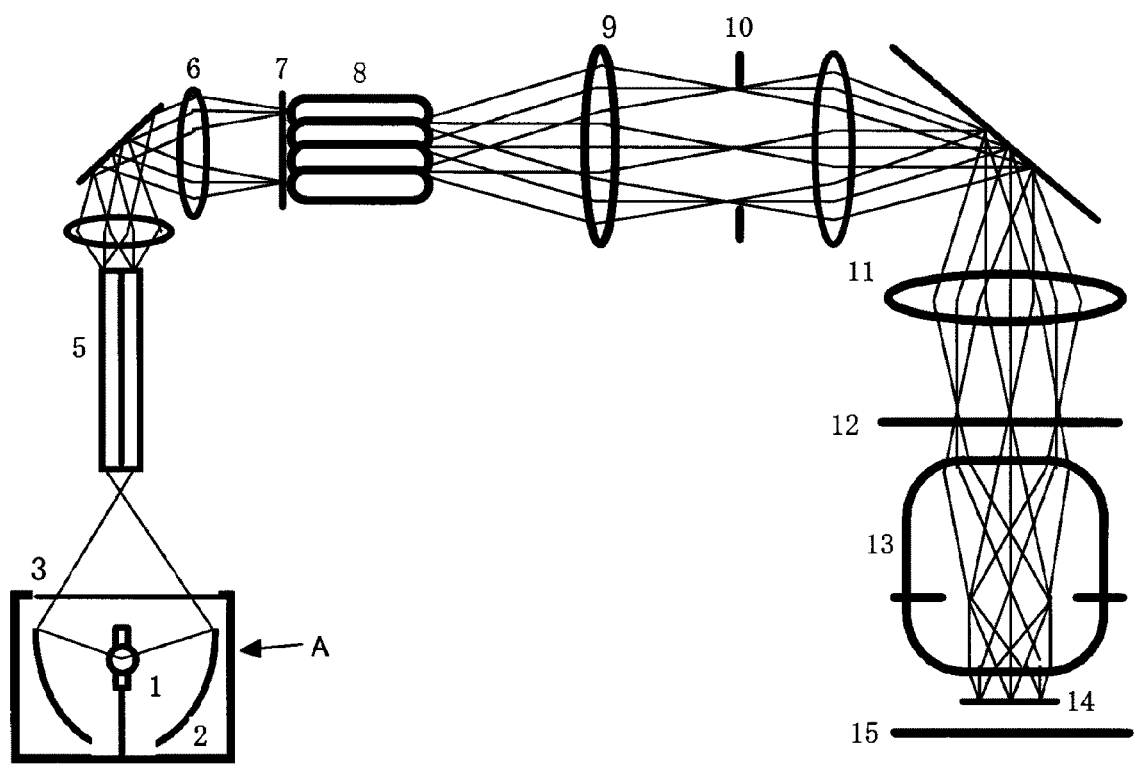
FIG. 7 is an optical path diagram of an exposure apparatus to which the projection optical system according to the first embodiment or the second embodiment is applicable.

A description will be given of an exposure apparatus that includes the projection optical system 100 or 110. FIG. 7 is a block diagram of the exposure apparatus. This exposure apparatus is a step-and-repeat exposure apparatus (scanner) but is applicable to a step-and-repeat exposure apparatus (stepper). The exposure apparatus is a projection exposure apparatus configured to illuminate an original 12, such as a mask or a reticle, using an illumination optical system and light from a light source 1, and to project a pattern of the original onto a substrate 14, such as a wafer or a liquid crystal substrate, via a projection optical system 13.

The light source is an i-line mercury lamp. Reference numeral 2 denotes a mirror configured to condense the light from the light source, and the light source 1 and the mirror 2 are housed in the lamp house A. Reference numeral 3 is a transparent plane-parallel plate, and spatially separates the inside of the lamp house A from other parts in the exposure apparatus.

The illumination optical system includes an internal reflection member 5, a relay lens 6, a band-pass filter 7, a fly-eye lens 8, a condenser lens 9, a masking blade 10, and a relay lens 11. The internal reflection member 5 forms a uniform light source distribution on an exit plane by the internal reflections. The relay lenses 6 and 11 relay the light. The band-pass filter 7 filters off light other than the light having a targeted wavelength. The fly-eye lens 8 forms a plurality of secondary light sources used to uniformly illuminate the original 12. The masking blade 10 defines an illumination area. The condenser lens 9 forms a light intensity distribution on the masking blade 10, which is made by superimposing light beams wavefront-split by the fly-eye lens 8.

The projection optical system 13 can apply the projection optical system 100 or 110. The original 12 is placed on the first object plane O, and the substrate 14 is placed on the second object plane.

The substrate 14 is driven by a substrate stage 15.

In exposure, the projection optical system 13 maintains an imaging characteristic in a broad exposure area even when the output of the light source 1 is enhanced, the throughput can be improved.

A method of manufacturing a device (semiconductor integrated circuit device and a liquid crystal display device) includes the step of exposing the photosensitive agent applied substrate (wafer or glass plate) using the exposure apparatus of one of the above embodiments, the step of developing the substrate, and other well-known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-261105, filed Oct. 7, 2008, which is hereby incorporated by reference herein in its entirety.

What is claimed is:

1. A projection optical system used for an exposure apparatus that uses an i-line as a light source, and configured to project a pattern of an original that is placed on an object plane onto a substrate that is placed on an image plane, the projection optical system comprising a plurality of lenses made of a plurality of types of different glass materials which include a lens having an Abbe number equal to or smaller than 62, wherein the plurality of lenses include, in order from the object plane along an optical path, a first lens unit having a positive power, a second lens unit having a negative power, a third lens unit having a positive power, a fourth lens unit having a negative power, and a fifth lens unit having a positive power, wherein the projection optical system satisfies following equations, where NAO is a numerical aperture of the projection optical system on the object plane, $\beta$ is an imaging magnification of the projection optical system, Td is a distance on an optical axis from the object plane to the image plane, Dt is a sum of thicknesses of the glass materials on the optical axis in the projection optical system, OB1max is a maximum object height on the object plane, and OB2max is a maximum image height on the image plane:

$0.125 \leq NAO$ $-0.251 < \beta < -0.249$ $80 \text{ mm} \leq |OB1\text{max}|$ $20 \text{ mm} \leq |OB2\text{max}|$ $|Dt/(NAO \cdot |OB1\text{max}|)| \leq 62.0$ $Dt/Td \leq 0.645$ $0.072 \leq |OB1\text{max}|/Td1$.

2. The projection optical system according to claim 1, wherein following equations are met, where S1 is an air conversion distance from the object plane to a surface on an object plane side of one of the lenses that are made of a glass material that is not quartz and has a refractive index of 1.48 or higher, which is closest to the object plane, and S2 is an air conversion distance from the image plane to a surface on an image plane side of one of the lenses that are made of a glass material that is not quartz and has a refractive index of 1.48 or higher, which is closest to the image plane:

$102 \text{ mm} \leq S1$ $80 \text{ mm} \leq S2$.

3. The projection optical system according to claim 1, wherein following equations are met, where d1 is a sum of thicknesses of the glass materials of the first lens unit on the optical axis, and d2 is a sum of thicknesses of the glass materials of the second lens unit on the optical axis:

$(d1+d2)/Td \leq 0.165$ $(d1+d2)/Dt \leq 0.250$.

4. The projection optical system according to claim 1, wherein following equations are met, where Kt is the number of lenses made of the glass material that has a refractive index equal to or higher than 1.57 or the Abbe number equal to or smaller than 62, and Gt is a sum of thicknesses on the optical axis of the glass materials each of which has a refractive index equal to or higher than 1.57 or an Abbe number equal to or smaller than 62:

$Kt \leq 5$ $Gt/Td \leq 0.050$.

5. The projection optical system according to claim 1, wherein following equations are met, where P1 is a distance along the optical axis between a pupil and a surface on an image plane side of one of the lenses which is placed on an object plane side of the pupil and closest to the pupil, and P2 is a distance along the optical axis between the pupil and a surface on the image plane side of one of the lenses which is placed on the image plane side of the pupil and closest to the pupil:

$$0.010 \leq |P1/Td|$$

$$0.014 \leq |P2/Td|.$$

6. The projection optical system according to claim 1, wherein one of the lenses that is closest to the pupil and arranged on an object plane side or an image plane side of the pupil is made of quartz.

7. The projection optical system according to claim 1, wherein the second lens unit includes at least two quartz lenses.

8. An exposure apparatus that uses an i-line as a light source, the exposure apparatus comprising a projection optical system configured to project a pattern of an original that is placed on an object plane onto a substrate that is placed on an image plane, wherein the projection optical system includes a plurality of lenses made of a plurality of types of different glass materials which include a lens having an Abbe number equal to or smaller than 62, wherein the plurality of lenses include, in order from the object plane along an optical path, a first lens unit having a positive power, a second lens unit having a negative power, a third lens unit having a positive power, a fourth lens unit having a negative power, and a fifth lens unit having a positive power, and wherein the projection optical system satisfies following equations where NAO is a numerical aperture of the projection optical system on the object plane, β is an imaging magnification of the projection optical system, Td is a distance on an optical axis from the object plane to the image plane, Dt is a sum of thicknesses of the glass materials on the optical axis in the projection optical system, OB1max is a maximum object height on the object plane, and OB2max is a maximum image height on the image plane:

$$0.125 \leq NAO$$

$$-0.251 < \beta < -0.249$$

$$80 \text{ mm} \leq |OB1\text{max}|$$

$$20 \text{ mm} \leq |OB2\text{max}|$$

$$|Dt/(NAO \cdot |OB1\text{max}|)| \leq 62.0$$

$$Dt/Td \leq 0.645$$

$$0.072 \leq |OB1\text{max}|/Td1.$$

9. A device manufacturing method comprising:
exposing a substrate using an exposure apparatus; and developing the substrate that has been exposed, wherein the exposure apparatus uses an i-line as a light source, and includes a projection optical system configured to project a pattern of an original that is placed on an object plane onto a substrate that is placed on an image plane, wherein the projection optical system includes a plurality of lenses made of a plurality of types of different glass materials which include a lens having an Abbe number equal to or smaller than 62, wherein the plurality of lenses include, in order from the object plane along an optical path, a first lens unit having a positive power, a second lens unit having a negative power, a third lens unit having a positive power, a fourth lens unit having a negative power, and a fifth lens unit having a positive power, and wherein the projection optical system satisfies following equations where NAO is a numerical aperture of the projection optical system on the object plane, β is an imaging magnification of the projection optical system, Td is a distance on an optical axis from the object plane to the image plane, Dt is a sum of thicknesses of the glass materials on the optical axis in the projection optical system, OB1max is a maximum object height on the object plane, and OB2max is a maximum image height on the image plane:

$$0.125 \leq NAO$$

$$-0.251 < \beta < -0.249$$

$$80 \text{ mm} \leq |OB1\text{max}|$$

$$20 \text{ mm} \leq |OB2\text{max}|$$

$$|Dt/(NAO \cdot |OB1\text{max}|)| \leq 62.0$$

$$Dt/Td \leq 0.645$$

$$0.072 \leq |OB1\text{max}|/Td|.$$

* * * * *